(12) United States Patent
Cheng et al.

(10) Patent No.: US 7,190,044 B1
(45) Date of Patent: Mar. 13, 2007

(54) FUSE STRUCTURE FOR A SEMICONDUCTOR DEVICE

(75) Inventors: Chun-Wen Cheng, Hsinchu (TW); Chia-Wen Liang, Hsinchu (TW); Ruey-Chyr Lee, Taichung (TW); Sheng-Yuan Hsueh, Baoshan Township, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 31 days.

(21) Appl. No.: 11/162,150

(22) Filed: Aug. 30, 2005

(51) Int. Cl.
*H01L 29/00* (2006.01)
(52) U.S. Cl. .............. 257/529; 257/E23.149; 257/E21.592
(58) Field of Classification Search .............. 257/529, 257/530, E23.149, E21.592
See application file for complete search history.

(56) References Cited

U.S. PATENT DOCUMENTS

2005/0258504 A1* 11/2005 Cheng et al. .............. 257/528
2006/0022300 A1* 2/2006 Wu et al. .................. 257/529

* cited by examiner

*Primary Examiner*—Ngân V. Ngô
(74) *Attorney, Agent, or Firm*—Jianq Chyun IP Office (57) ABSTRACT

A fuse structure for a semiconductor device is provided. The fuse structure includes a fuse layer between the upper and bottom insulating layers. The fuse layer is connected to the other metal layers through via plugs. The fuse layer includes separate blocks and at least a connecting block and is coupled to at least a heat buffer block of a different layer. Because the heat buffer block is coupled to the blocks of the fuse layer, new fusing point and a new path for effectively dissipating the heat are provided and a longer and sinuous electric current path is obtained between the blocks through the heat buffer blocks. The heat buffer block and the blocks coupled to the heat buffer block can avoid large current flowing through the fuse structure and prevent overheating.

29 Claims, 7 Drawing Sheets

FUSE STRUCTURE FOR A SEMICONDUCTOR DEVICE

BACKGROUND OF THE INVENTION

1. Field of the Invention

This invention generally relates to a fuse structure for a semiconductor device, and more particularly to a fuse structure having at least a heat buffer block for a semiconductor device.

2. Description of Related Art

As the size of a semiconductor device becomes smaller, the semiconductor device is more seriously affected due to impurity or defect in itself. A defect of a single diode or transistor may cause the whole chip to fail. To solve this problem, some redundant circuits connected to fuses generally will be added into the circuit. When a defect is found in a circuit, the fuses can be used to disable the defected circuit and enable the redundant circuit. For memory devices, the defected cell can be replaced by a non-defected cell to its address. Another reason to use fuses in the integrated circuits is to permanently write the controlling bytes such as ID codes into the chip.

Generally, the fuses are made of polysilicon or metal. Laser fuses and electronic fuses are two major types of fuses based on how the fuses are blown to be open. The laser fuses will be blown by the laser beam; and the electronic fuses will be blown by currents. The electronic fuses are generally applied to EEPROM devices, while the laser fuses are generally applied to DRAM devices.

Generally, an integrated circuit has a passivation layer including silicon nitride, silicon oxide or both at the top thereof. For the layout of the laser fuse, to prevent the passivation layer from damage, an opening at the top layer is required and the laser beam has to precisely focus on the fuse in order not to damage the adjacent devices. However, it is common that the passivation layers neighboring to the fuses are damaged due to the strong power of the laser beam.

For the layout of the electronic polysilicon fuse, it requires a high voltage to generate a current big enough to heat the fuse to rupture the fuse. When the size is getting smaller, the voltage that the integrated circuit can provide is decreased. Hence, a silicide layer is disposed on the (polysilicon) fuse so that an appropriate voltage can blow the fuse. Since the heat generated by the current can enhance the electron migration, the silicide layer and the polysilicon fuse will agglomerate together to make the silicide layer rupture and the grains of the polysilicon re-grow.

To make the fuse open means either the fuse is ruptured, the silicide layer on the polysilicon fuse is fused, or the post-burn resistance of the polysilicon fuse is so high to deem open.

As the conditions of the manufacturing process and the applied voltage frequently change, even after applying the voltage to blow the fuse, the remaining fuse may be found or the post-burn resistance is not stable, which affects the reliability and the performance of the devices. Further, the heat generated by the current my also deteriorates the adjacent devices and affects their reliability.

SUMMARY OF THE INVENTION

An object of the present invention is to provide a fuse structure that can be blown by a low voltage, and the heat generated by the current will not damage the adjacent devices.

Another object of the present invention is to provide a fuse structure having heat buffer blocks to enhance the reliability of the fuse structure.

Still another object of the present invention is to provide a fuse structure that can be blown by a low voltage/current, wherein the heat buffer blocks can effectively dissipate the heat generated by the current so that the neighboring devices will not be degraded by heat, thus improving the stability of the devices.

The present invention provides a fuse for a semiconductor device or a integrated circuit, comprising: a first insulating layer; a fuse layer on the first insulating layer, a second insulating layer on the fuse layer and a top layer on the second insulating layer. The fuse layer includes a plurality of blocks and the second insulating layer includes a plurality of via plugs. The top layer includes at least a heat buffer block on the second insulating layer. Since the via plugs connect the heat buffer block and the blocks of the fuse layer, the blocks of the fuse layer are coupled to the heat buffer block.

The present invention provides a fuse for a semiconductor device or a integrated circuit. According to one embodiment of this invention, the fuse structure includes at least a heat buffer block, thus providing a better thermal conducting path for effectively dissipating the heat around the fusing points, or even transfer the heat to another layer. Since the fuse layer of another embodiment in this invention comprises a plurality of blocks, a longer and sinuous electric current path with more fusing points is obtained between the blocks of the fuse layer through the heat buffer blocks. Thus, the sensitivity and reliability of the fuse structure are increased.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

Figure 1:
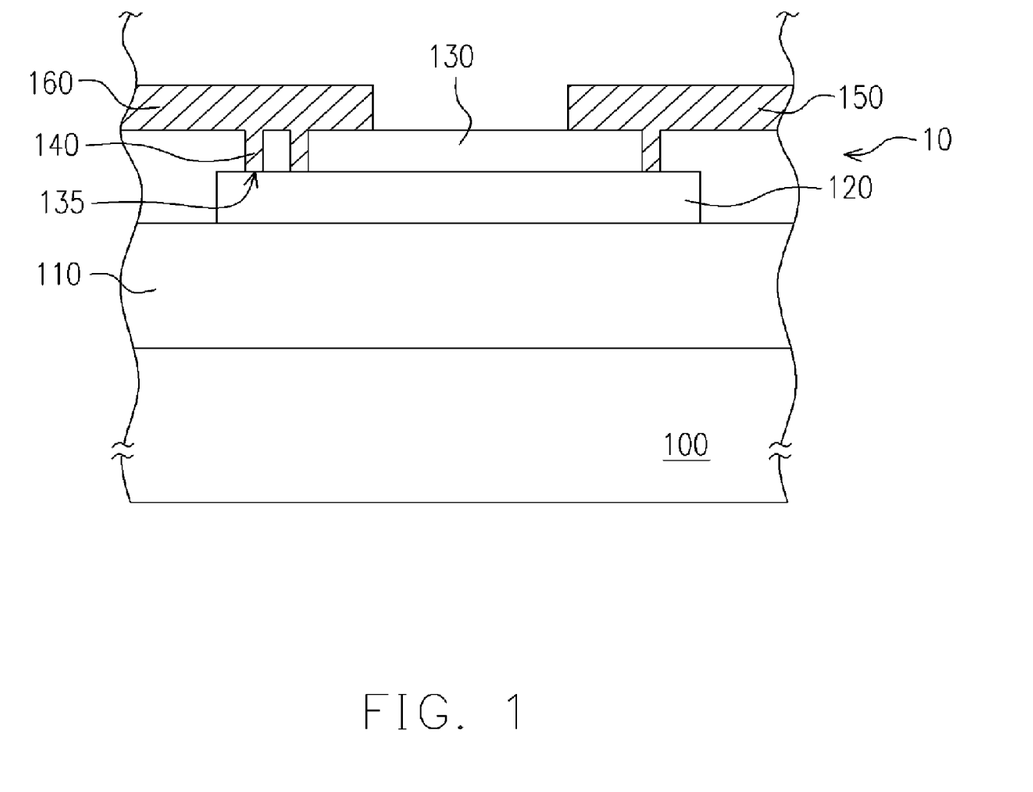
FIG. 1 is a cross-sectional view of a fuse structure.
Figure 2:
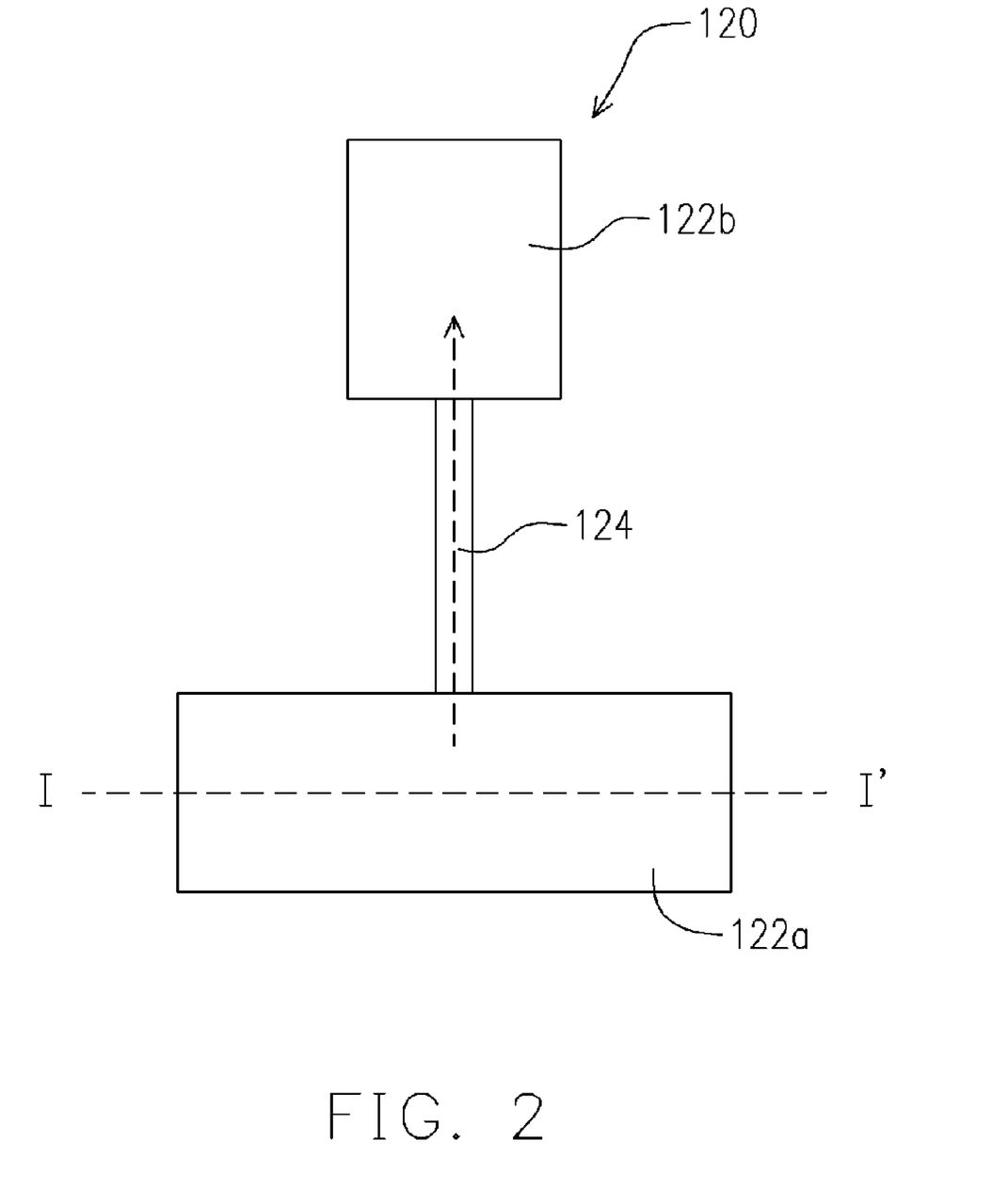
FIG. 2 is a top view of a fuse structure of FIG. 1.

FIG. 1 is a cross-sectional view of a fuse structure along the I–I' line of FIG. 2. The fuse structure 10 is formed in a semiconductor device or an IC. The fuse structure 10 is formed on a substrate 100. The substrate 100 may further includes another semiconductor device elements (not shown) formed thereon. A bottom insulating layer 110 is formed on the substrate 100. The bottom insulating layer 110 includes an oxide layer such as a silicon oxide layer or spin-on glass layer. A fuse layer 120 is formed on the bottom insulating layer 120. The fuse layer 120 can be a composite layer including a polysilicon layer and a silicide layer, for example. The material of the silicide layer includes titanium silicide, cobalt silicide, nickel silicide, and platinum silicide. The fuse layer 120 also can be a metal layer or a metal alloy layer. The material of the metal layer includes titanium, tungsten, aluminum, and copper. The thickness of the fuse layer 120 is adjustable. The resistivity of the fuse layer can be adjusted by changing the material, length, width and thickness of the fuse layer. Generally, the resistivity of the fuse layer is higher than the other metal line and the interconnects for an ideal fuse structure.

An upper insulating layer 130 is formed to cover the fuse layer 120. The upper insulating layer 130 includes an oxide layer such as a silicon oxide layer or SOG. Then a patterned photoresist layer (not shown) is formed as a mask to define the via hole 135. The number and size of the via holes vary depending on the needs. A plurality of via holes 135 is inside the upper insulating layer 130 to connect the subsequent formed top metal pad layers 150 and 160, and the fuse layer 120. After removing the upper insulating layer that is not covered by the patterned photoresist layer, a plurality of via plugs 140 is formed inside the via holes 135. The via plugs can be formed by sputtering a metal layer (not shown) into the via holes to fill the via holes and etching back the undesired metal until the metal layer levels with the upper insulating layer. Then the first and second top metal pad layers 150 and 160 are formed on the upper insulating layer 130 and the via plugs 140.

When a current is applied to the first top metal pad layer 150, the current flows into the fuse layer 120 through the via plugs 140, and then enters the second top metal pad layer 160 through the via plugs 140. The application of the current can also be in the reverse direction based on the design of the device. FIG. 2 is a top view of a fuse structure in accordance with one preferred embodiment of the present invention. In a preferred embodiment, the fuse layer 120 has two wider areas 122a and 122b and a narrower area 124 between the two wider areas 122a and 122b. When the current (flowing in the direction of the leader arrow) flows from the area 122a through the area 124 to the area 122b, because the area 124 is smaller, the current density flowing through the area 124 is higher. Likewise, when the current flows from the area 122b through the area 124 to the area 122a, because the area 124 is smaller, the current density flowing through the area 124 is higher.

Hence, compared with the wider areas 122a and 122b, the area 124 is deemed to be a high-resistance narrow channel with higher current density flowing through, which results in higher temperature and stronger electron migration in this local area 124. Therefore, the area 124 is considered a fusing point because it is narrower and is thus easy to be blown out. Based on this design, only a smaller current or voltage is required to blow out the narrower portion of the fuse.

However, this design may still cause damage to the adjacent devices due to the heat generated by the current, especially in the narrower portion.

Therefore, the present invention provides a fuse structure having at least a heat buffer block to prevent the device from being damaged by the heat generated by the current. However, the total resistance of the fuse structure is not increased.

Figure 3:
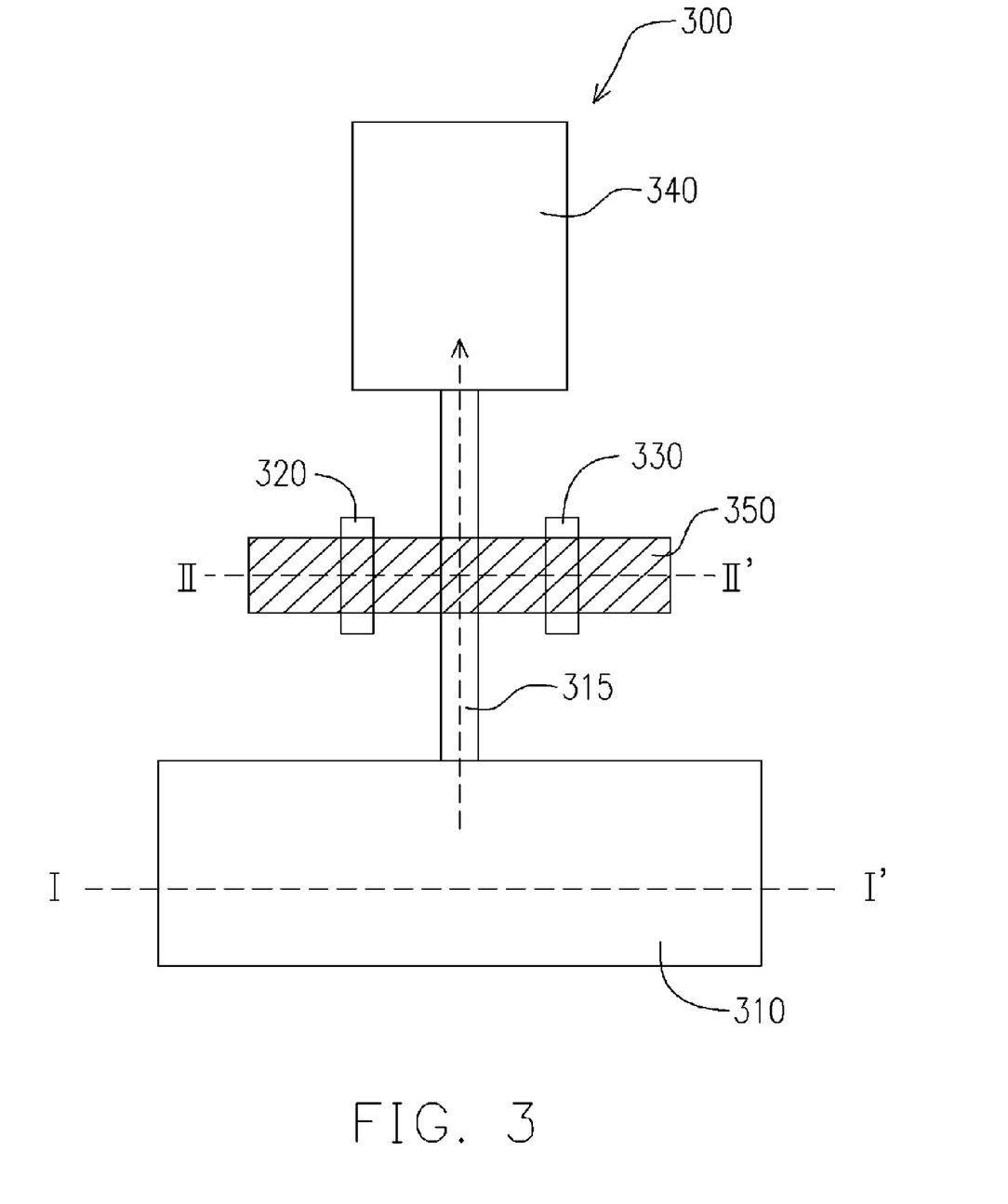
FIG. 3 is a top view of a fuse structure having a heat buffer block in accordance with one preferred embodiment of the present invention.

In one preferred embodiment, the fuse structure is formed in a semiconductor device or in an IC. The fuse structure has a fuse layer with a heat buffer block. FIG. 3 is a top view of a fuse structure in accordance with one preferred embodiment of the present invention. The fuse layer 300 includes a first block 310, a second block 320, a third block 330, a fourth block 340, and a connecting block 315 connecting the first block 310 and the fourth block 340. The second and third blocks 320 and 330 are between the first and fourth blocks 310 and 340. The connecting block 315 is between the second and third blocks 320 and 330, but the connecting block 315 does not connect the second and third blocks 320 and 330. The second and third blocks 320 and 330 are not connected to each other. The first, second, third, and fourth blocks are not connected to one another except for the connection between the first and fourth blocks by the connecting block 315. The second and third blocks 320, 330 are coupled to the heat buffer block 350 through the via plugs (not shown). The heat buffer block 350 is in a level different from the fuse layer 300, so that the heat buffer block 350 can only be coupled to the second and third blocks 320, 330 through via plugs. The heat buffer block 350 is not coupled to the first and fourth blocks.

Figure 4:
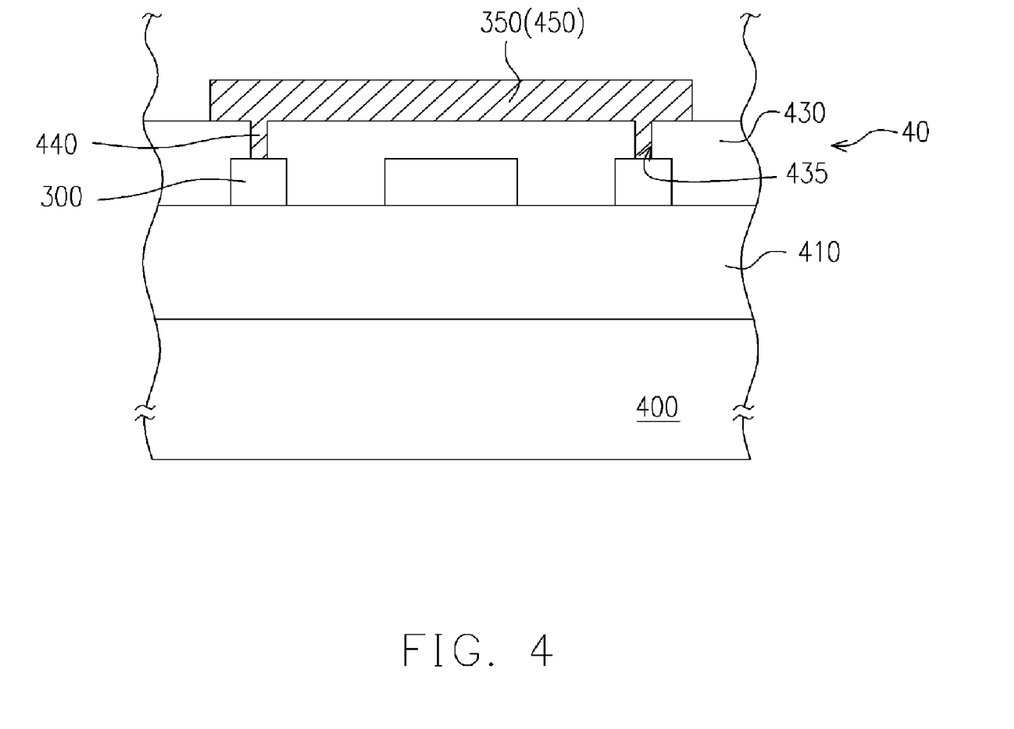
FIG. 4 is a cross-sectional view of a fuse structure of FIG. 3 along the II–II' line.

The cross-sectional view of the fuse structure along the I–I' line of FIG. 3 is similar to that of FIG. 1. FIG. 4 is a cross-sectional view of a fuse structure of FIG. 3 along the II–II' line. The fuse structure 40 is formed over a substrate 400. The fuse structure 40 includes a bottom insulating layer 410 formed on the substrate 400, a fuse layer 300 on the bottom insulating layer 410, and an upper insulating layer 430 covering the fuse layer 300. The size and the pattern of the fuse layer 300 can be adjusted by photolithography technology as needed. The fuse layer 300 can be a composite layer including a polysilicon layer and a silicide layer, for example. The material of the silicide layer includes titanium silicide, cobalt silicide, nickel silicide, and platinum silicide. The fuse layer 300 also can be a metal layer or an alloy layer. The material of the metal layer includes titanium, tungsten, aluminum, and copper. The thickness of the fuse layer 300 is adjustable. The resistivity of the fuse layer can be adjusted by changing the material, length, width and thickness of the fuse layer. Generally, the resistivity of the fuse layer is higher than the other metal line and the interconnects for an ideal fuse structure. The upper insulating layer 430 includes via holes 435 that are defined by the photolithography technology. A plurality of via plugs 440 can be formed in the via holes 435. The material of the via plugs 440 can be titanium, tungsten, aluminum, and copper. The number and size of the via plugs vary depending on the design needs. As shown in FIG. 4, a plurality of via plugs 440 is disposed in the upper insulating layer 430 to connect the heat buffer block 350 and the fuse layer 300. The heat buffer block 350 is on the upper insulating layer 430 and on the via plugs 440. The method for forming the heat buffer block 350 includes forming a top metal layer 450 on the upper insulating layer 430 and the via plugs 440 and patterning the top metal layer 450 to form the heat buffer block 350 and the other top metal pad layer (not shown) by photolithography technology. The material of the top metal layer 450 can be titanium, tungsten, aluminum, and copper. The thickness of the top metal layer 450 is adjustable. The pattern of the top metal layer 450 can be altered based on the requirements of the process. The heat buffer block 350 has a better heat (thermal) conductivity than the fuse layer 300. Hence the heat buffer block 350 can help to dissipate the heat. The top metal pad layers (as shown in FIG. 1) can be used as a current input pad for the fuse structure or for connecting the fuse structure with other devices in the integrated circuit.

When the current (flowing in the direction of the leader arrow) flows from the first block 310 through the connecting block 315 to the fourth block 340, because the area of the connecting block 315 is smaller than the areas of the first and fourth blocks 310 and 340, the current density flowing through the connecting block 315 is higher. Hence, compared with the wider first and fourth blocks, the narrower connecting block 315 is deemed to be a high-resistance narrow channel with higher current density flowing through, which results in higher temperature and enhanced electron migration in the connecting block 315. The connecting block 315 is considered a fusing point because it is narrower and is thus easy to be blown out (either ruptured or open by high post-burn resistance). Likewise, when the current flows from the fourth block 340 through the connecting block 315, then to the first block 310, because the area of the connecting block 315 is smaller compared to its abutting blocks 310 and 340, the current density flowing through the connecting block 315 is higher and the connecting block 315 becomes the fusing point.

Compared to FIG. 2, since the fuse layer 300 of this embodiment has a heat buffer block not coupled to the current path but coupled to the second and third blocks that is not coupled to the first and fourth blocks. Hence, the connection of the heat buffer block and the second and third blocks provides a new path for conducting heat to effectively dissipate the heat. When the connecting block 315 is overheated due to the higher current density flowing through the narrower area, the thermal conducting path provided by the heat buffer block 350 and the second and third blocks can effectively dissipate the heat around the connecting block 315.

Figure 5:
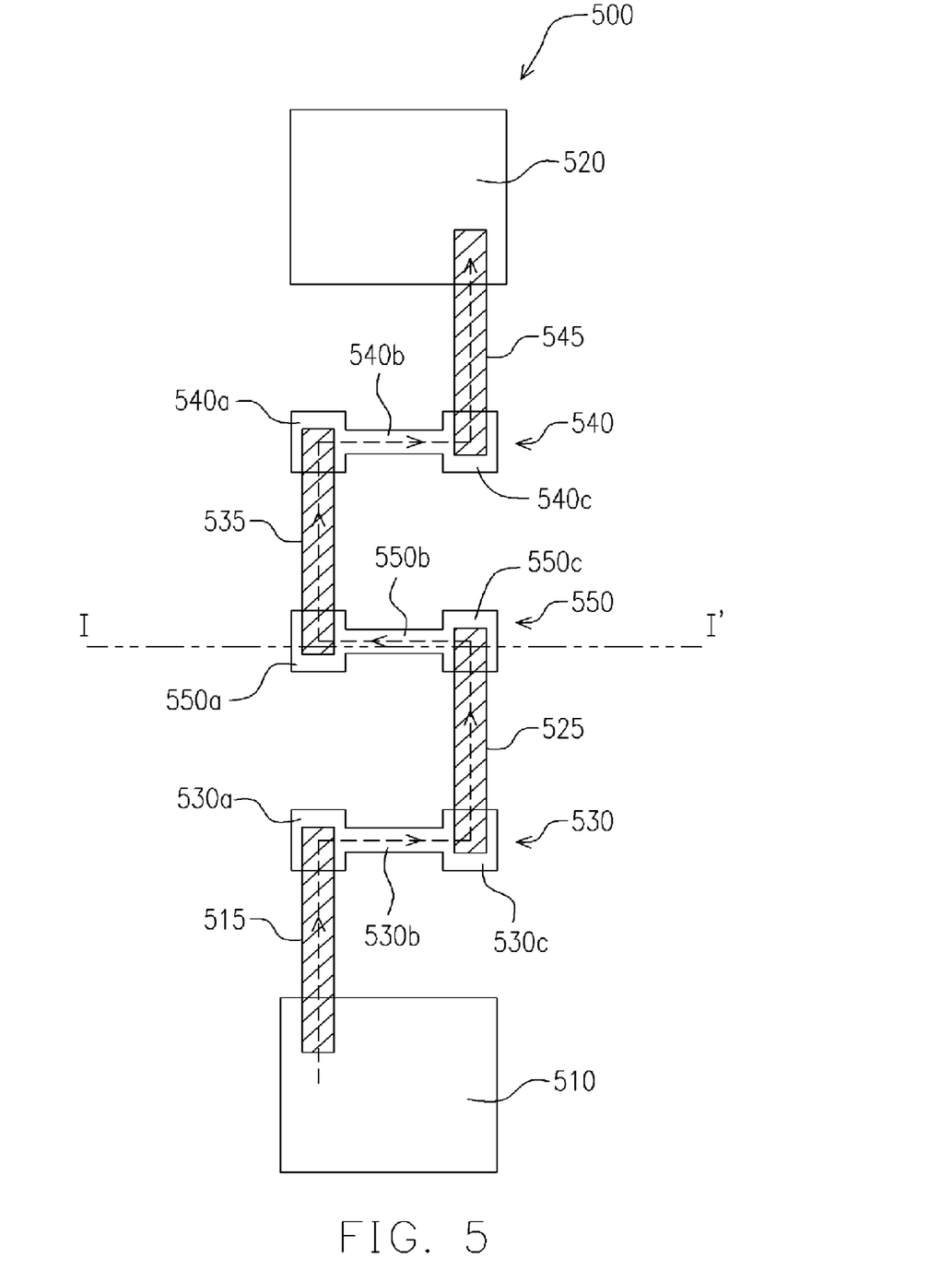
FIG. 5 is a top view of a fuse structure having heat buffer blocks in accordance with another preferred embodiment of the present invention.

In another preferred embodiment, the fuse structure can also be formed in a semiconductor device or in an IC. However, the fuse structure has a fuse layer with at least a heat buffer block, and preferably with a plurality of heat buffer blocks. FIG. 5 is a top view of a fuse structure in accordance with another preferred embodiment of the present invention. The fuse layer 500 includes a first block 510, a second block 520, a first inner block 530, a second inner block 540 and a third inner block 550. The first inner block 530, the second inner block 540 and the third inner block 550 are disposed between the first and second blocks 510, 520, while the first inner block 530 is close to the first block 510, the second inner block 540 is close to the second block 520 and the third inner block 550 is between the first and second inner blocks 530, 540. All blocks are not connected to one another.

Each inner block 530, 540 or 550 is composed of three blocks. Each inner block is, for example, shaped as a dumb-bell shape, i.e. the rectangle or ellipse with a neck or a waist. That is, the first inner block 530 is composed of a first terminal block 530a, a second terminal block 530c and a first connecting block 530b connecting the first and the second terminal blocks 530a, 530c, while the first and the second terminal blocks 530a, 530c are wider than the first connecting block 530b. The second inner block 540 is composed of a third terminal block 540a, a fourth terminal block 540c and a second connecting block 540b connecting the third and the fourth terminal blocks 540a, 540c, while the third and the fourth terminal blocks 540a, 540c are wider than the second connecting block 540b. The third inner block 550 is composed of a fifth terminal block 550a, a sixth terminal block 550c and a third connecting block 550b connecting the fifth and the sixth terminal blocks 550a, 550c, while the fifth and the sixth terminal blocks 550a, 550c are wider than the third connecting block 550b. The shape of the terminal block is not limited to rectangular, but can be polygonal, round, or triangular. Not only the width or length of each connecting block can be adjusted, but also the connecting location of the terminal block and the connecting block can be adjusted, according to the layout design.

Although the first and second blocks 510 and the first inner block 530, the second inner block 540 and the third inner block 550 disposed between the first and second blocks 510 are not connected to one another, a plurality of heat buffer blocks of a different layer is coupled to these blocks of the fuse layer through via plugs (not shown), thus electrically connecting these blocks of the fuse layer. Referring to FIG. 5, a first heat buffer block 515 is coupled to the first block 510 and the first terminal block 530a of the first inner block 530; a second heat buffer block 525 is coupled to the second terminal block 530c of the first inner block 530 and the sixth terminal block 550c of the third inner block 550; a third heat buffer block 535 is coupled to the fifth terminal block 550a of the third inner block 550 and the third terminal block 540a of the second inner block 540; and a fourth heat buffer block 545 is coupled to the fourth terminal block 540c of the second inner block 540 and the second block 520. The heat buffer blocks 515, 525, 535 and 545 are in a level different from the fuse layer 300, so that the heat buffer blocks are coupled to and electrically connect the blocks of the fuse layer through via plugs.

Figure 5A:
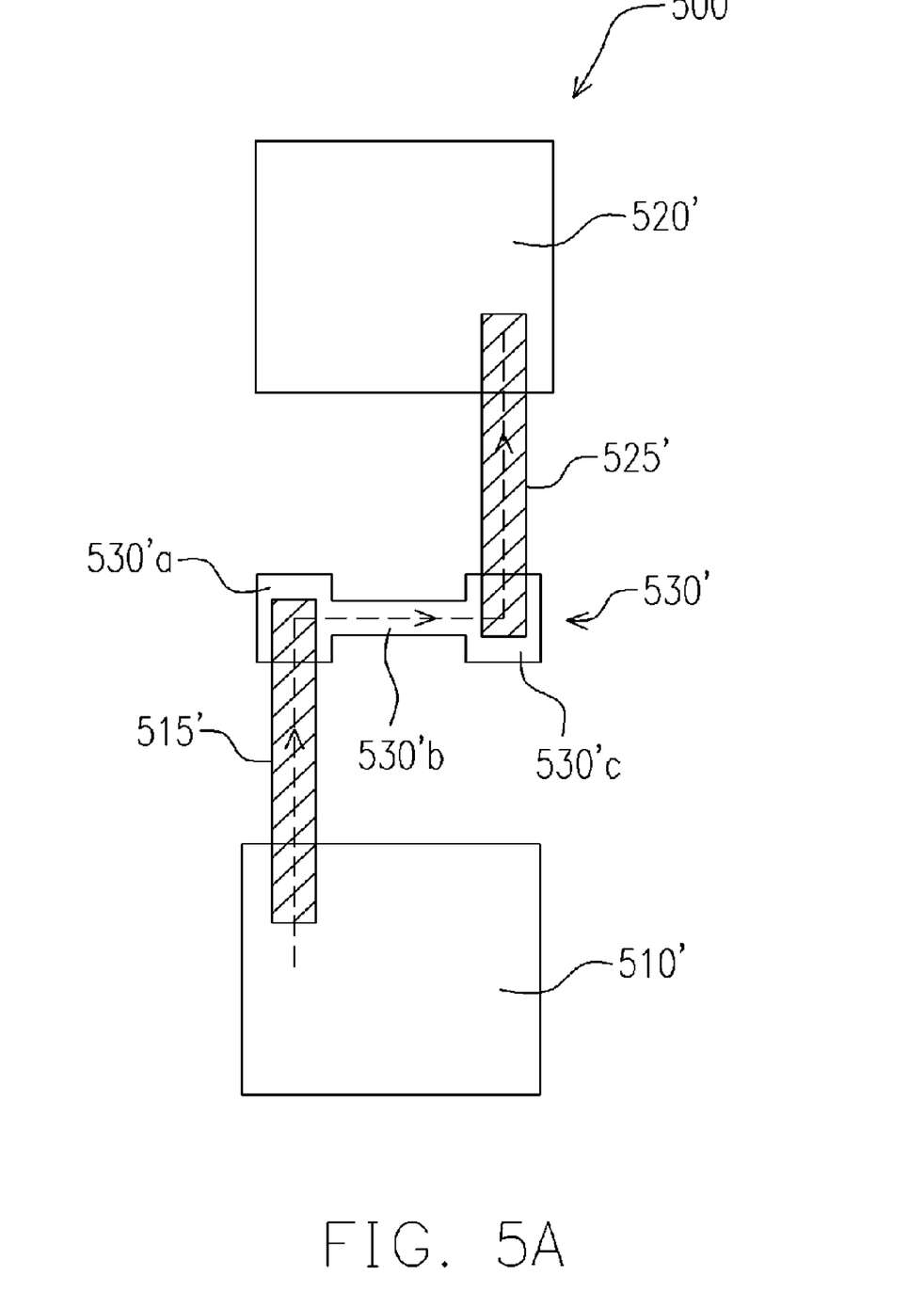
FIG. 5A is a top view of a fuse structure having a heat buffer block in accordance with another preferred embodiment of the present invention.

Alternatively, FIG. 5A is a top view of a fuse structure in accordance with another preferred embodiment of the present invention. The fuse layer 500' includes a first block 510', a second block 520' and an inner block 530' disposed between the first and second blocks 510', 520'. All these blocks are not connected to one another. The inner block 530' is composed of three blocks and is, for example, shaped as a dumb-bell shape, i.e. the rectangle or ellipse with a neck or a waist. The inner block 530' is composed of a first terminal block 530'a, a second terminal block 530'c and a connecting block 530'b connecting the first and the second terminal blocks 530'a, 530'c, while the first and the second terminal blocks 530'a, 530'c are wider than the connecting block 530'b. Similarly, the heat buffer blocks of a different layer are coupled to these blocks of the fuse layer through via plugs (not shown), thus electrically connecting these blocks of the fuse layer. Referring to FIG. 5A, a first heat buffer block 515' is coupled to the first block 510' and the first terminal block 530'a of the inner block 530', while a second heat buffer block 525' is coupled to the second terminal block 530'c of the first block 530' and the second block 520'.

Figure 6:
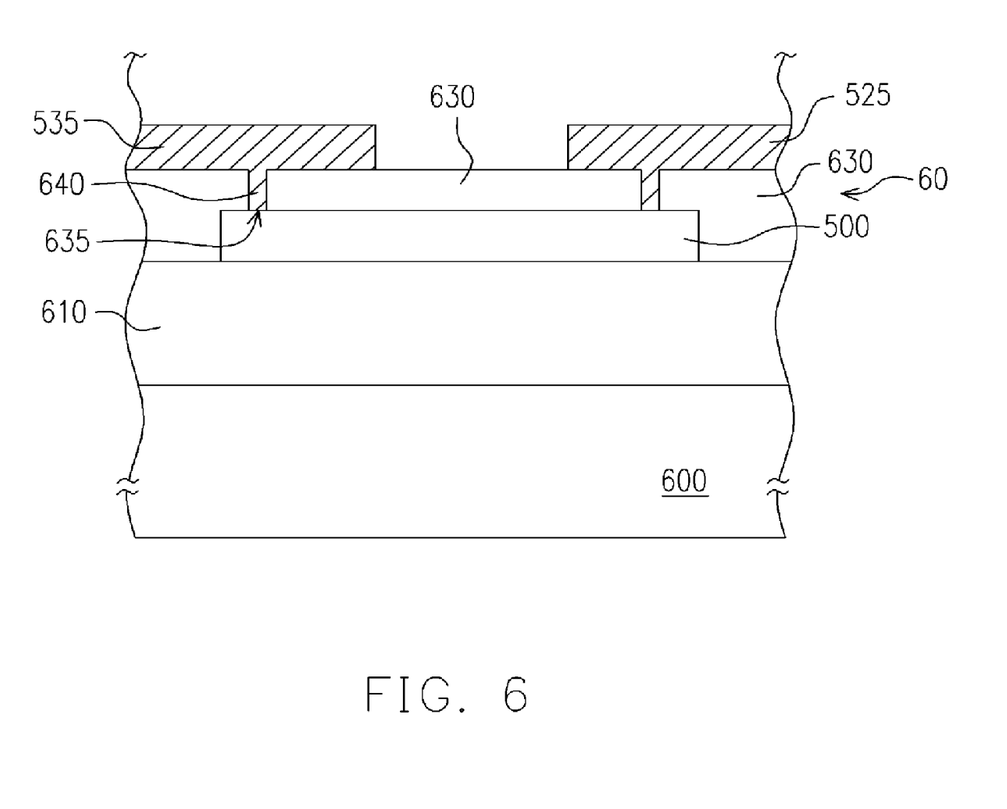
FIG. 6 is a cross-sectional view of a fuse structure of FIG. 5 along the I–I' line.

FIG. 6 is a cross-sectional view of the fuse structure of FIG. 5 along the I–I' line. The fuse structure 60 is formed over a substrate 600. The fuse structure 60 includes a bottom insulating layer 610 formed on the substrate 400, a fuse layer 500 on the bottom insulating layer 610, and an upper insulating layer 630 covering the fuse layer 500. The size and the pattern of the fuse layer 500 can be adjusted by photolithography technology as needed and according to the design of the preferred embodiments. The fuse layer 500 can be a composite layer including a polysilicon layer and a silicide layer, for example. The material of the silicide layer includes titanium silicide, cobalt silicide, nickel silicide, and platinum silicide. The fuse layer 500 also can be a metal layer or an alloy layer. The material of the metal layer includes titanium, tungsten, aluminum, and copper. The thickness of the fuse layer 500 is adjustable. The resistivity of the fuse layer can be adjusted by changing the material, length, width and thickness of the fuse layer. Generally, the resistivity of the fuse layer is higher than the other metal line and the interconnects for an ideal fuse structure. The upper insulating layer 630 includes via holes 635 that are defined by the photolithography technology. A plurality of via plugs 640 can be formed in the via holes 635. The material of the via plugs 640 can be titanium, tungsten, aluminum, and copper. The number and size of the via plugs vary depending on the design requirements. As shown in FIG. 6, a plurality of via plugs 640 is disposed in the upper insulating layer 630 to connect the heat buffer blocks and the fuse layer 500. The heat buffer blocks are on the upper insulating layer 630 and on the via plugs 640. The method for forming the heat buffer blocks includes forming a top layer 660 on the upper insulating layer 630 and the via plugs 640 and patterning the top layer 660 to form the heat buffer blocks 525, 535 (as shown) and the other top metal pad layer (not shown) by photolithography technology. The thickness of the top layer 660 is adjustable. The pattern of the top layer 660 can be altered based on the requirements of the process. The material of the top layer 660 can be a metal, such as, titanium, tungsten, aluminum, and copper, or even polysilicon. Preferably, the heat buffer blocks have a better heat (thermal) conductivity than the fuse layer 500, the heat buffer blocks can thus help to dissipate the heat. The top metal pad layers (as shown in FIG. 1) can be used as a current input pad for the fuse structure or for connecting the fuse structure with other devices in the integrated circuit.

Referring back to FIG. 5 or 5A, when the current (flowing in the direction of the leader arrow) flows from the first block 510 through the inner blocks and the heat buffer blocks to the second block 520, because the areas of the connecting blocks of the inner blocks are smaller than the areas of the terminal blocks of the inner blocks, the current density flowing through the connecting blocks is higher. Hence, compared with the wider terminal blocks of the inner blocks, the narrower connecting blocks 530b, 540b, 550b or 530'b are deemed to be high-resistance narrow channels with higher current density flowing through, which results in higher temperature and enhanced electron migration in the connecting blocks 530b, 540b, 550b or 530'b. The connecting blocks 530b, 540b, 550b and 530'b (FIG. 5A) are considered fusing points because they are narrower and are thus easy to be blown out (either ruptured or open by high post-burn resistance). Likewise, when the current flows from the second block 520 through the inner blocks and the heat buffer blocks to the first block 510, because the area of the connecting blocks of the inner blocks are smaller compared to their abutting terminal blocks, the current density flowing through the connecting blocks is higher and the connecting blocks 530b, 540b, 550b and 530'b become the fusing points. Moreover, according to the design of the layout, the shape of any heat buffer block can also be adjusted, so that the current density flowing through the specific region (i.e. the narrower region) of the heat buffer block(s) is higher and the specific region of the heat buffer block(s) becomes the fusing point. On the other hand, the resistivity of the connecting via plug(s) can be carefully designed, so that the via plug(s) can become the fusing point, if necessary.

Compared to FIG. 2, since the fuse layer 500 of FIG. 5 has a plurality of inner blocks and a longer and sinuous electric current path is obtained between the first and second blocks through the heat buffer blocks and the inner blocks. Thus, the current flowing through the longer and serpentine electric current path is smaller than the current flowing through the fuse structure of FIG. 2. Further, since the current flowing through the fuse structure of this embodiment is smaller, if the fuse layer is a composite layer of polysilicon and silicide, electro-migration occurs at the fusing points to make the silicide fused and the post-burn resistance of the fuse is high enough to deem open. Therefore, the design of this embodiment can avoid such large current flowing through the fuse structure of FIG. 2 and prevent overheating. If the fuse layer is a metal layer or an alloy layer, the design of this embodiment can allows larger current flowing through. Moreover, because a plurality of fusing points is present in the fuse structure of this embodiment, the sensitivity and reliability of the fuse structure are increased.

In addition, the heat buffer blocks coupled to the blocks and the inner blocks become new paths for conducting heat to effectively dissipate the heat. When the connecting blocks are over-heated due to the higher current density flowing through the narrower area, the thermal conducting paths provided by the heat buffer blocks and the coupled blocks can effectively dissipate the heat around the connecting blocks, or even transfer the heat to another layer.

Hence, the fuse structure of the present invention including at least a heat buffer block and separate blocks can provide a more effective heat conducting path, which can improve the heat dissipation and the reliability of the fuse structure, and prevent the negative impact due to the high heat of the fuse. For the devices adjacent to the fuse, the risk of overheating is reduced and the process window is thus increased because the heat generated by the current will be dissipated efficiently by the thermal buffer block.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A fuse of a semiconductor device, comprising:
  a first insulating layer;
    a fuse layer on said first insulating layer, said fuse layer including a first block, a second block, a third block, a fourth block, a connecting block connecting said first and fourth blocks, said second and third blocks being between said first and fourth blocks, the connecting block being between said second and third blocks but not connected to said second and third blocks, said first, second, third, and fourth blocks being not connected to one another except said first and fourth blocks being connected by said connecting block;
    a second insulating layer on said fuse layer, said second insulating layer including a plurality of via plugs; and
    a top metal layer on said second insulating layer and connected to said plurality of via plugs, said top metal layer including a heat buffer block, said heat buffer block being coupled to said second and third blocks but not being coupled to said first and fourth blocks.

2. The fuse of claim 1, wherein said fuse layer includes a polysilicon layer and a silicide layer.

3. The fuse of claim 2, wherein a material of said silicide layer is selected from the group consisting of titanium silicide, cobalt silicide, nickel silicide, and platinum silicide.

4. The fuse of claim 1, wherein said fuse layer includes a polysilicon layer.

5. The fuse of claim 1, wherein said fuse layer includes a metal layer.

6. The fuse of claim 5, wherein a material of said metal layer is selected from the group consisting of titanium, tungsten, aluminum, and copper.

7. The fuse of claim 1, wherein said fuse layer includes a metal alloy layer.

8. The fuse of claim 7, wherein a material of said metal alloy layer is selected from the group consisting of titanium, tungsten, aluminum, and copper.

9. The fuse of claim 1, wherein said first insulating layer includes a silicon oxide layer.

10. The fuse of claim 1, wherein said second insulating layer includes a silicon oxide layer.

11. The fuse of claim 1, wherein said top metal layer includes a metal layer, and a material of said metal layer is selected from the group consisting of titanium, tungsten, aluminum, and copper.

12. The fuse of claim 1, wherein materials of said via plugs are selected from the group consisting of titanium, tungsten, aluminum, and copper.

13. A fuse of a semiconductor device, comprising:
a first insulating layer on a semiconductor substrate;
a fuse layer on said first insulating layer, said fuse layer including at least a first block, a second block, and at least an inner block between said first and the second blocks, said first and second blocks and said inner block being not connected to one another, wherein each of said inner blocks includes two terminal regions wider than an intermediary portion of the inner block;
a second insulating layer on said fuse layer, said second insulating layer including a plurality of via plugs; and
a top metal layer on said second insulating layer and connected to said plurality of via plugs, said top metal layer including a plurality of heat buffer blocks, said heat buffer blocks not being connected to one another, wherein said heat buffer blocks include at least a first heat buffer block being coupled to said first block and said inner block and a second heat buffer block being coupled to said inner block and said second block.

14. The fuse of claim 13, wherein said fuse layer includes a polysilicon layer and a silicide layer.

15. The fuse of claim 14, wherein a material of said silicide layer is selected from the group consisting of titanium silicide, cobalt silicide, nickel silicide, and platinum silicide.

16. The fuse of claim 13, wherein said fuse layer includes a polysilicon layer.

17. The fuse of claim 13, wherein said fuse layer includes a metal layer.

18. The fuse of claim 17, wherein a material of said metal layer is selected from the group consisting of titanium, tungsten, aluminum, and copper.

19. The fuse of claim 13, wherein said fuse layer includes a metal alloy layer.

20. The fuse of claim 19, wherein a material of said metal alloy layer is selected from the group consisting of titanium, tungsten, aluminum, and copper.

21. The fuse of claim 13, wherein said first insulating layer includes a silicon oxide layer.

22. The fuse of claim 13, wherein said second insulating layer includes a silicon oxide layer.

23. The fuse of claim 13, wherein said top metal layer includes a metal layer, and a material of said metal layer is selected from the group consisting of titanium, tungsten, aluminum, and copper.

24. The fuse of claim 13, wherein materials of said via plugs are selected from the group consisting of titanium, tungsten, aluminum, and copper.

25. A fuse of a semiconductor device, comprising:
a first insulating layer on a semiconductor substrate;
a polysilicon fuse layer on said first insulating layer, said polysilicon fuse layer including a first block, a second block, and a first inner block, a second inner block and at least a third inner block between said first and the second blocks, said first inner block being close to said first block, said second inner block being close to said second block, and at least said third inner block being between said first and second inner blocks, said first and second blocks and said inner blocks being not connected to one another, wherein each of said inner blocks includes two terminal regions wider than an intermediary portion of the inner block;
a second insulating layer on said polysilicon fuse layer, said second insulating layer including a plurality of via plugs; and
a top layer on said second insulating layer and connected to said plurality of via plugs, said top layer including a plurality of heat buffer blocks, said heat buffer blocks not being connected to one another, wherein said heat buffer blocks include a first heat buffer block being coupled to said first block and said first inner block, a second heat buffer block being coupled to said first inner block and said third inner block, a third heat buffer block being coupled to said third inner block and said second inner block, and a fourth heat buffer block being coupled to said second inner block and said second block, wherein the heat buffer blocks are electrically connected to the blocks of the polysilicon fuse layer through said plurality of via plugs.

26. The fuse of claim 25, wherein said polysilicon fuse layer further includes a silicide layer.

27. The fuse of claim 25, wherein said top layer includes a metal layer, and a material of said metal layer is selected from the group consisting of titanium, tungsten, aluminum, and copper.

28. The fuse of claim 25, wherein said top layer includes a polysilicon layer and a silicide layer, and a material of said silicide layer is selected from the group consisting of titanium silicide, cobalt silicide, nickel silicide, and platinum silicide.

29. The fuse of claim 25, wherein materials of said via plugs are selected from the group consisting of titanium, tungsten, aluminum, and copper.

* * * * *